(12) United States Patent
Nabeya

(10) Patent No.: US 7,539,959 B2
(45) Date of Patent: May 26, 2009

(54) LIBRARY CREATING APPARATUS AND METHOD, AND RECORDING MEDIUM RECORDING LIBRARY CREATING PROGRAM THEREON

(75) Inventor: Kenichi Nabeya, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 326 days.

(21) Appl. No.: 11/406,302

(22) Filed: Apr. 19, 2006

(65) Prior Publication Data

US 2007/0168901 A1    Jul. 19, 2007

(30) Foreign Application Priority Data

Jan. 16, 2006   (JP) .............................. 2006-007892

(51) Int. Cl.
*G06F 17/50* (2006.01)
(52) U.S. Cl. ................................. 716/4; 716/1; 703/13
(58) Field of Classification Search ........................ None
See application file for complete search history.

(56) References Cited

U.S. PATENT DOCUMENTS

| 6,053,949 A | 4/2000 | Takai et al. ................... 703/15 |
| 6,691,284 B2* | 2/2004 | Kashyap ........................ 716/1 |
| 2006/0020441 A1* | 1/2006 | Toyoda et al. ................. 703/19 |

FOREIGN PATENT DOCUMENTS

JP    10-149385    6/1998

* cited by examiner

*Primary Examiner*—Leigh Marie Garbowski
(74) *Attorney, Agent, or Firm*—Staas & Halsey LLP

(57) ABSTRACT

In order to efficiently create a library of characteristic values of a low hierarchical circuit, which library is used in operation verification of circuitry including low hierarchical circuitry and high hierarchical circuitry, so that the time period necessary to create a library is considerably reduced, the present apparatus includes a recognizing unit which recognizes a simulation object circuit in circuitry; a simulation unit which simulates the simulation object circuit; and a creating unit which creates a library of characteristic values of the simulation object circuit based on the simulation result obtained by said simulation unit.

18 Claims, 15 Drawing Sheets

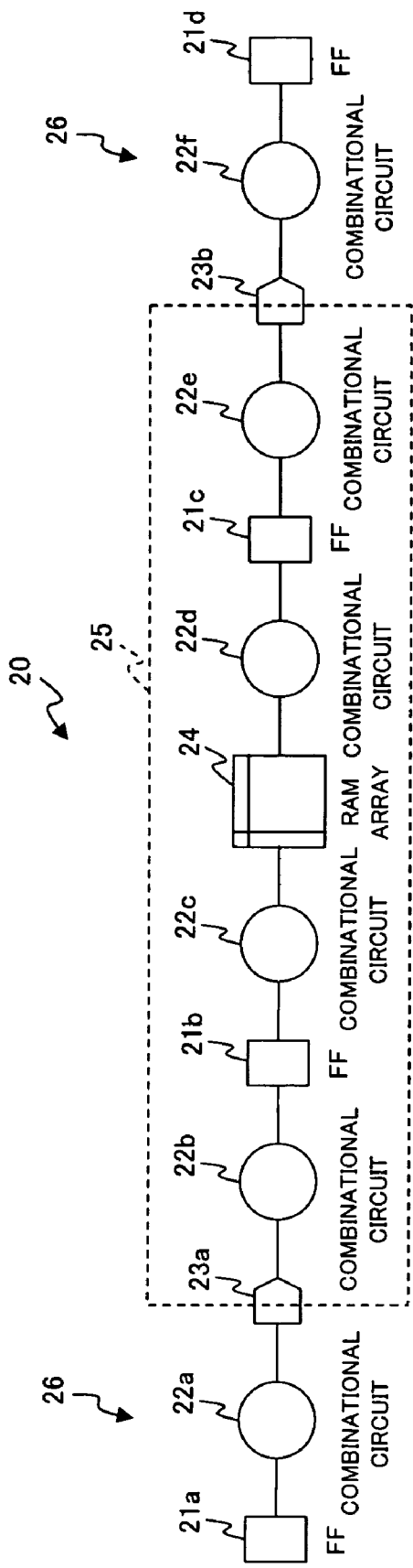

RAM BIT CELL    RAM ARRAY

TRANSISTOR

LIBRARY CREATING APPARATUS AND METHOD, AND RECORDING MEDIUM RECORDING LIBRARY CREATING PROGRAM THEREON

BACKGROUND OF THE INVENTION

1) Field of the Invention

The present invention relates to an art for creating a library which is used in operation verification of circuitry designed in a hierarchical form.

2) Description of the Related Art

A method of hierarchical design has often been employed at design of large-scale circuitry. In hierarchical design, upper-level large-scale circuitry is divided into multiple lower-level small-scale circuits. After design and operation verification (hereafter, also simply called verification) are performed for each of the small scale circuits, the small scale circuits, having already been designed, are combined, and then design and verification is performed for the upper-level large-scale circuitry.

Here, the number of hierarchical levels used in hierarchical design is not limited to two, the upper level and the lower level, and three or more hierarchical levels can be employed in design.

At verification of hierarchically designed circuitry, some lower-level circuits (regions) are sufficient to be verified by themselves. Some other lower-level circuits need to be combined before verification as upper-level circuits, and some other lower-level circuits need to be combined with upper-level circuits to be verified.

When an upper-level circuit is verified, libraries are firstly created, one for each of the multiple lower-level circuits, and generally speaking, such libraries are then combined to perform operation verification of the upper-level circuit. Here, a library means a table, etc., recording therein characteristic values of a circuit. Such a library is realized by storing characteristic values of each circuit in a recording medium, such as a memory or a hard disk, in association with the circuits.

Preparing such libraries of lower-level circuits makes it possible to efficiently perform verification of upper-level circuits, and the time required for verification is reduced.

In such a case, the libraries of lower-level circuits must include information sufficient to perform verification of the upper-level circuits.

Here, as an example of verification of circuitry, a description will be made of delay verification among FFs (Flip-Flops) 101a through 101f of asynchronous circuit 100 of FIG. 10. That is, as shown in FIG. 11, a description will be made of delay verification between FFs in order to evaluate whether or not a signal can travel from a certain FF to the next FF in the downstream direction (the direction in which the signal proceeds) during one cycle time (for example, 1 sec/frequency).

As shown in FIG. 10, the synchronous circuit 100 includes multiple (here, six) FFs 101a through 101f. In this example, circuitry (indicated by the one-dotted line in FIG. 10) ranging from the terminal 104 to the terminal 105, which circuitry includes FFs 101c through 101e, is given as a lower-level circuit 102. The other parts of the synchronous circuit 100 than the lower-level circuit 102 thereof are given as upper-level circuits 103.

Like this synchronous circuit 100, hierarchical design would sometimes result in multiple FFs 101c through 101e present in a lower-level circuit 102.

In this case, as shown in FIG. 12, delay verification among multiple FFs 101c through 101e, that is, between the FF 101c and the FF 101d and between the FF 101d and the FF 101e, can be carried out in the lower level circuit 102.

That is, if there are is an FF for sending a signal and an FF for receiving the signal within the lower-level circuit 102, delay verification between these two FFs can be performed within the lower-level circuit 102.

In contrast, in the synchronous circuit 100, delay verification of a region between FFs whose hierarchical level is separated by the lower-level circuit 102, that is, a region between the FF 101b and the FF 101c and a region between the FF 101e and the FF 101f, cannot be performed within the lower-level circuit 102. Thus, the lower-level circuit 162 should be combined with the upper level circuit 103 for verification.

Accordingly, in the lower-level circuit 102, as to a part upstream of the FF 101c where an upstream FF 101b for sending out a signal is not present, that is, a part ranging from the terminal 104, which is the input end (upstream end) of the lower-level circuit 102, to the FF 101c, a library of delay (characteristic value) of this part is created. In addition, in the upper-level circuit 103, as to a part between the FF 101b and the terminal 104, which is the output terminal thereof, a library of delay of this part is created. Then, these libraries are combined and verified, delay verification between the FF 101b and the FF 101c being thereby performed.

Likewise, in the lower-level circuit 102, as to a part downstream of the FF 101e where a downstream FF 101f for receiving a signal is not present, that is, a part ranging from the terminal 105, which is the output end (downstream end) of the lower-level circuit 102, to the FF 101e, a library of delay (characteristic values) of this part is created. In addition, in the upper-level circuit 103, as to a part between the FF 101f and the terminal 105, which is the input terminal thereof, a library of delay of this part is created. Then, these libraries are combined and verified, delay verification between the FF 101e and the FF 101f being thereby performed.

Next, taking an example of the circuit 110 with a construction shown in FIG. 13, a description will be made hereinbelow of a simulation method (library creating method) used when timing analysis (delay verification) of the whole of the circuit 110 is performed. It is to be noted that this simulation method is also used in delay verification of the lower-level circuit 102 of FIG. 10 having already been described.

In the beginning, a description will be made of the circuit 110 of FIG. 13. The circuit 110 includes a RAM (Random Access Memory), FFs (latches), and combinational logics (combinational circuits), and each of these is formed by a combination of transistors.

When timing analysis of the whole of the circuit 110 is performed, a collective simulation of the whole of the circuit 110 will not be executed. As shown in the flowchart (step S100 through step S105) of FIG. 14, an analysis object circuit 110 is divided into simulation unit circuits, and delay characteristics are measured for each simulation unit circuit, and the measured characteristics are summed up (statistic timing analysis).

More specifically, a designer inputs and selects a simulation object circuit 110 (step S100), and when a simulator for executing simulation acknowledges the circuit 110 (step S101), the simulator divides the circuit 110 into multiple simulation unit regions (simulation unit circuits) 110a through 110e as shown in FIG. 15 (step S102).

This dividing process (the above step S102) of the simulation unit regions 110a through 110e is carried out by separating the circuit 110 at points appropriate for separation (for example, the number of transistors, the operation content of circuits, or timing characteristics).

Then, the simulator performs simulation for each simulation unit region, which has been obtained as a result of separation (step S103), and characteristics for each simulation unit region are obtained (step S104).

This simulation process (the above step S103) uses a simulator [represented by a SPICE (Simulation Program with Integrated Circuit Emphasis)] to perform operation simulation, thereby measuring characteristics, such as delay, of each of the simulation unit regions.

After that, the simulator totalizes the characteristics of each of the simulation unit regions obtained by the simulation process (step S104), and the totalized characteristics are recorded and stored in a memory, a library being thereby created (step S105). The processing then ends.

In cases where a desired path whose library is to be created is composed of multiple simulation unit regions, the totalizing process (the above step S104) of characteristics of each simulation unit region is realized by totalizing the characteristics of the multiple simulation unit regions. As the simplest totalizing method, the characteristics of the multiple simulation unit regions are summed up, whereby the totalizing process is carried out.

Taking an example where the characteristic obtained as a result of the simulation process is a delay time, when a library of delay of a desired path is to be created, delay times as the characteristics of the multiple simulation unit regions forming the path are summed up, whereby a delay time of the desired path is obtained.

More concretely, when applying the above technique to the lower-level circuit 102 of FIG. 10, the totalizing process of the characteristic recognizes a region from the FF 101c to the FF 101d and a region from the FF 101d to the FF 101e as separate paths whose libraries are to be created. As a result of the totalizing process, the characteristic value of these paths is calculated.

In this instance, various methods for simulating logic circuits have been proposed (for example the following patent document 1).

Here, when hierarchical design is carried out as described above with reference to FIG. 10, the lower-level circuit 102 includes circuitry (region) whose verification must be performed with the lower-level circuit 102 and the upper-level circuit 103 combined with each other, and also circuitry (region) whose verification can be performed within the lower-level circuit 102.

More specifically, a region from the input end (terminal 104) of the lower-level circuit 102 to the FF 101c and a region from the output end (terminal 105) to the FF 101e must be combined with the upper-level circuit 103 at the time of verification. In contrast, a region from the FF 101c to the FF 101d and a region from the FF 101d to the FF 101e can be verified within the lower-level circuit 102.

However, in the previous art, when the lower-level circuit 102 and the upper-level circuit 103 are combined for verification of the synchronous circuit 100, verification of the whole of the lower-level circuit 102 is performed once again, and a library is created, taking the whole of the lower-level circuit 102 as an object.

Therefore, verification and library creation are carried out for a region from the FF 101c to the FF 101d and a region from the FF 101d to the FF 101e, regions for which combination with the upper-level circuit 103 for verification is unnecessary, so time is expended in useless processing.

Moreover, such circuitry, whose library need not be created, is also divided into simulation unit regions with the simulation technique (library creating method) shown in FIG. 14, and the thus-obtained multiple simulation unit regions are simulated, so that a long time is expended in the simulation processing. Further, since the process of totalizing characteristics obtained as a result of simulation of the multiple simulation unit regions is also necessary, the process time for creating a library is greatly increased.

[Patent Document] Japanese Patent Application Laid-open No. HEI 10-149385

SUMMARY OF THE INVENTION

With the foregoing problems in view, it is an object of the present invention to make it possible to efficiently create a library of characteristic values of the low hierarchical circuit, which library is used in operation verification of circuitry which is designed to have a hierarchical form with low hierarchical circuitry and high hierarchical circuitry, so that the time period necessary to create a library is considerably reduced.

In order to accomplish the above object, according to the present invention, there is provided a library creating apparatus, comprising: a recognizing unit which recognizes a simulation object circuit in circuitry; a simulation unit which simulates the simulation object circuit recognized by the recognizing unit; and a creating unit which creates a library of characteristic values of the simulation object circuit based on the simulation result obtained by the simulation unit.

As a preferred feature, the recognizing unit recognizes a circuit ranging from the input end of the circuitry to a specific circuit as the simulation object circuit to be simulated, and also, the recognizing unit recognizes a circuit ranging from the output end of the circuitry to a specific circuit as the simulation object circuit to be simulated.

As a preferred feature, the recognizing unit recognizes the simulation object circuit by deciding that a circuit containing a specific special circuit is not a simulation object circuit.

As a generic feature, there is provided a library creating method, comprising: recognizing a simulation object circuit in circuitry; simulating the simulation object circuit recognized by the recognizing step; and creating a library of characteristic values of the simulation object circuit based on the simulation result obtained by the simulating step.

As another generic feature, there is provided a recording medium recording thereon a library creating program for a computer to create a library of characteristic values of circuitry, wherein the program instructs the computer to function as the following: a recognizing unit which recognizes a simulation object circuit in circuitry; a simulation unit which simulates the simulation object circuit recognized by the recognizing unit; and a creating unit which creates a library of characteristic values of the simulation object circuit based on the simulation result obtained by the simulation unit.

As described above, according to the present invention, the recognizing unit recognizes a simulation object circuit whose library needs to be created, and the simulation unit simulates only the simulation object circuit recognized by the recognizing unit, and the creating unit creates a library of characteristic values of the simulation object circuit. In consequence, useless simulation processing and useless library creating processing for circuitry which need not be simulated are eliminated, so that a library is efficiently created and the time required for creating a library is considerably reduced.

Other objects and further features of the present invention will be apparent from the following detailed description when read in conjunction with the accompanying drawings.

BRIEF DESCRIPTION OF THE DRAWINGS

FIG. 3 is a diagram showing a construction of a circuit which is to be subjected to operation verification by the simulation apparatus according to the first and second embodiments of the present invention;

FIG. 4(a) is a circuit diagram showing an example of a construction of a RAM bit cell; FIG. 4(b) is a diagram showing a RAM construction in which RAM bit cells of FIG. 4(a) are connected;

DESCRIPTION OF THE PREFERRED EMBODIMENT(S)

Embodiments of the present invention will now be described with reference to the relevant accompanying drawings.

1 First Embodiment

Figure 1:
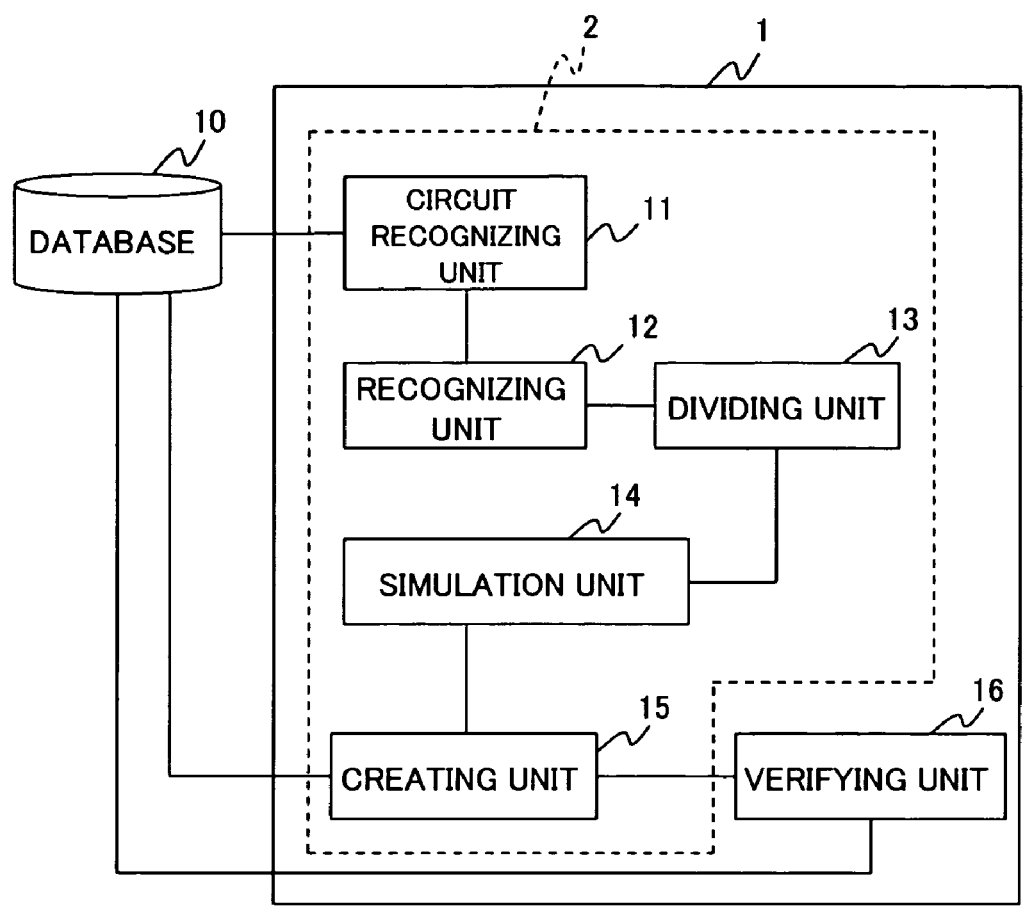
FIG. 1 is a block diagram showing a construction of a simulation apparatus according to a first embodiment of the present invention.

Referring to the block diagram of FIG. 1, a description will be made of a construction of a simulation apparatus 1 according to a first embodiment of the present invention. As shown in FIG. 1, the present simulation apparatus 1, which is connected to a database 10 which holds therein circuit design information created and input by a designer, includes a circuit acknowledging unit 11, a recognizing unit 12, a dividing unit 13, a simulation unit 14, a creating unit 15, and a verifying unit 16.

The present simulation apparatus 1 performs operation verification (delay verification) of the whole circuit whose design information is held in the database 10 or a high hierarchical circuit of such a circuit. In the simulation apparatus 1, the circuit acknowledging unit 11, the recognizing unit 12, the dividing unit 13, simulation unit 14, and the creating unit 15 function as a library creating apparatus 2 of the present invention.

Figure 2:
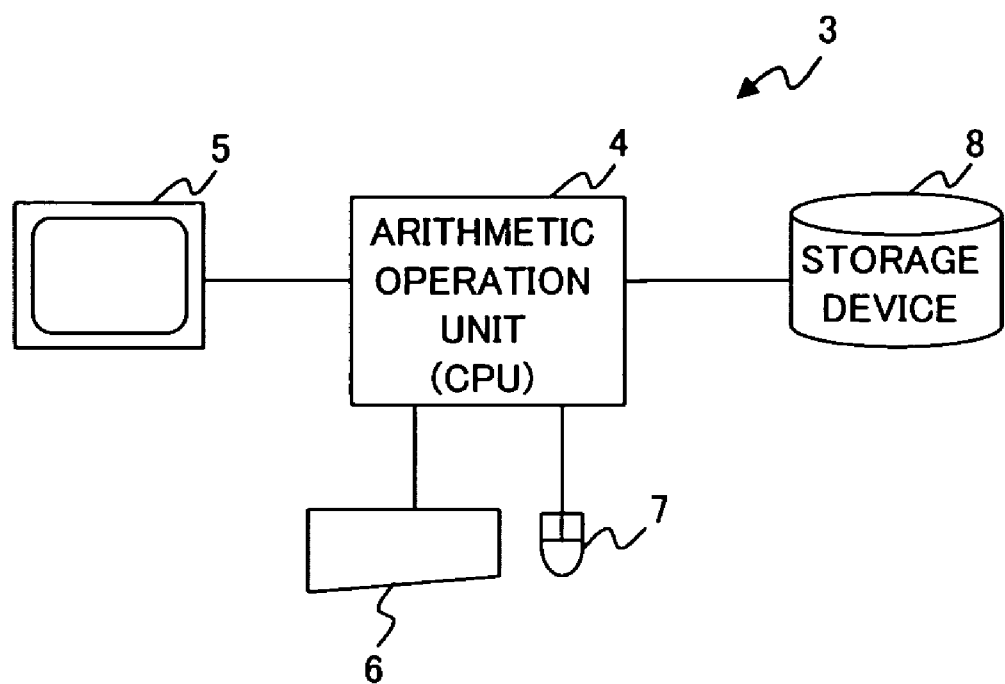
FIG. 2 is a diagram showing a configuration of a computer which realizes a simulation apparatus according to the first and second embodiments of the present invention.

As shown in FIG. 2, for example, the present simulation apparatus 1 is realized by an arithmetic operation unit [for example, a CPU (Central Processing Unit)] 4 of a computer having a monitor 5, a keyboard 6 and a mouse 7, as an input interface, and a storage device 8]. That is, the circuit acknowledging unit 11, the recognizing unit 12, the dividing unit 13, the simulation unit 14, the creating unit 15, and the verifying unit 16, of the simulation apparatus 1 are realized by the arithmetic operation unit 4 which executes a specified application program (a library creating program or a simulation program).

The database 10 holds the design information of circuits input and selected by designers using, for example, the keyboard 6 and the mouse 7. The circuit design information is hierarchical design, and it includes information about the hierarchical levels of circuits.

Further, the database 10 holds a library created by the creating unit 15.

Now, referring to FIG. 3, a description will be made hereinbelow of an example of a construction of a circuit whose design information is held in the database 10, which circuit is an object of operation verification performed by the simulation apparatus 1.

As shown in FIG. 3, the circuit 20, whose operation is to be verified by the simulation apparatus 1, includes a typical RAM (Random Access Memory) macro, and also includes FFs (Flip-Flops) 21a through 21d, combinational circuits 22a through 22f, an input terminal 23a, an output terminal 23b, and a RAM (RAM array) 24.

A typical RAM macro in this circuit 20 is a circuit ranging from the input terminal 23a to the output terminal 23b, which RAM macro corresponds to the lower hierarchical circuit 25.

That is, a signal incoming from the input terminal 23a passes through the combinational circuit 22b and is then received by the FF 21b, and an output from the FF 21b via the combinational circuit 22c accesses the RAM 24. Further, an output from the RAM 24 passes through the combinational circuit 22d and is then received by the FF 21c. An output of the FF 21c via the combinational circuit 22e is sent outside. Such a construction from the input terminal 23a through the output terminal 23b is a RAM macro, and is a low hierarchical circuit 25 of a circuit 20 which is hierarchically designed.

In the circuit 20, the circuitry other than the low hierarchical circuit 25 is high hierarchical circuits 26.

The present simulation apparatus 1 performs delay verification on the circuit 20 (here, operation verification on a combination of the low hierarchical circuit 25 and the high hierarchical circuits 26, that is, the circuit from the FF 21a through the FF 21b and the circuit from the FF 21c through the FF 21d). The library creating apparatus 2 creates a library of characteristic values of the low hierarchical circuit 25 which will be necessary when the delay verification of the circuit 20 is carried out.

The circuit acknowledging unit 11 reads design information of the circuit 20 held in the database 10 and acknowledges the circuit 20. It acknowledges not only the construction of the whole circuit 20 but also the hierarchical construction of the circuit 20. That is, the circuit acknowledging unit 11 acknowledges the low hierarchical circuit 25 and the high hierarchical circuit 26 of the circuit 20.

The recognizing unit 12 recognizes a simulation object circuit of the low hierarchical circuit 25 when the recognizing unit 12 carries out operation verification on the circuit 20 acknowledged by the circuit acknowledging unit 11.

Here, the simulation object circuit is a circuit which is subjected to simulation carried out by the simulation unit 14. That is, it is a circuit which is simulated and a library of characteristics obtained as the simulation results is created.

The recognizing unit 12 recognizes a simulation object circuit from the low hierarchical circuit 25 based on whether or not a specific special circuit (here, a RAM) is contained therein. By deciding that a circuit containing the special circuit is not a simulation object circuit, a simulation object circuit is extracted.

More specifically, the recognizing unit 12 detects the RAM 24 as the specific special circuit in the low hierarchical circuit 25, and recognizes the circuitry ranging from the FF 21b, which is arranged nearest to the detected RAM 24 on the upstream side in the direction in which a signal travels, to FF 21c, which is arranged nearest to the RAM 24 on the downstream side, as circuitry which need not be simulated. The recognizing unit 12 then recognizes the circuitry other than the above (in fact, the circuitry which need not be simulated), that is, the circuitry from the input terminal 23a to the FF 21b and the circuitry from the output terminal 23b to the FF 21c, as simulation object circuits.

Here, the recognizing unit 12 recognizes circuitry which need not be simulated and then decides that other circuitry in the low hierarchical circuit 25 than this circuitry, which need not be simulated, to be a simulation object circuit. This is because the RAM 24 is always interposed between two FFs in the low hierarchical circuit 25, and the low hierarchical circuit 25 never contains another FF than the above two FFs.

In other words, generally speaking, design of a special circuit, such as a RAM, makes analysis troublesome. Thus, such a special circuit is interposed between two FFs, and circuitry between the two FFs, which sandwich the special circuit therebetween, is determined to be contained in the same hierarchical level, and any other FF is never contained in this hierarchical level. This arrangement makes it possible to simplify the analysis.

Paying attention to this point, the present simulation apparatus 1 (library creating apparatus 2) utilizes this characteristic feature of design in the recognizing unit 12's recognition of circuitry whose simulation is unnecessary, and thereby recognizing other circuitry than the above as a simulation object circuit.

Figures 4A, 4B:
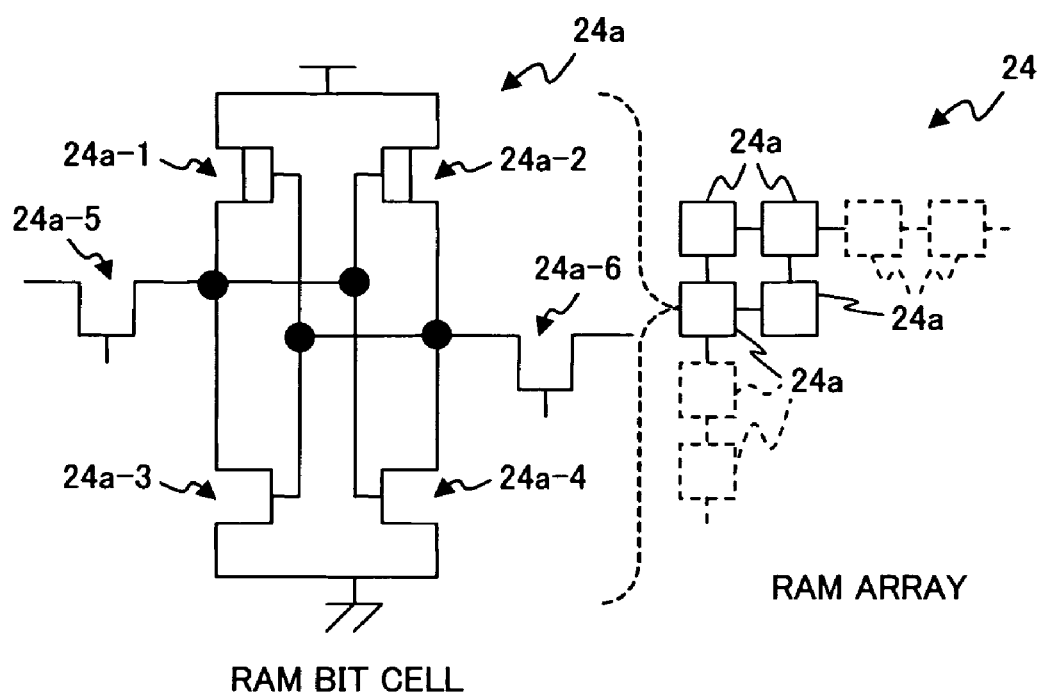
FIG. 4(a) and FIG. 4(b) each are a RAM (Random Access Memory) included in the circuit of FIG. 3.

Next, a description will be made hereinbelow of a method for detecting the RAM 24 by means of the recognizing unit 12. As shown in FIG. 4(a), the RAM 24 includes multiple RAM bit cells 24a each of which has multiple transistors 24a-1 through 24a-6. The multiple RAM bit cells 24a are connected as shown in FIG. 4(b).

As shown in FIG. 4(a), the transistors 24a-1 through 24a-6 in a RAM bit cell 24a have a particular connection relationship (for example, a connection relationship in which invertors cross each other).

Thus, the recognizing unit 12 searches the low hierarchical circuit 25 for a part having a relationship the same as the above-mentioned particular relationship. The recognizing unit 12 recognizes the found-out part as a RAM bit cell 24a, and continues the searching operation in the adjacent parts until a decision that an object is not a RAM bit cell 24a is made. Then, the recognizing unit 12 detects the whole of the recognized RAM bit cells 24a as a RAM 24.

As described above, the recognizing unit 12 checks a connection relationship between adjacent transistors, thereby detecting a RAM 24 in the low hierarchical circuit 25 based on the construction of a RAM bit cell 24a (that is the construction of RAM 24).

Figure 13:
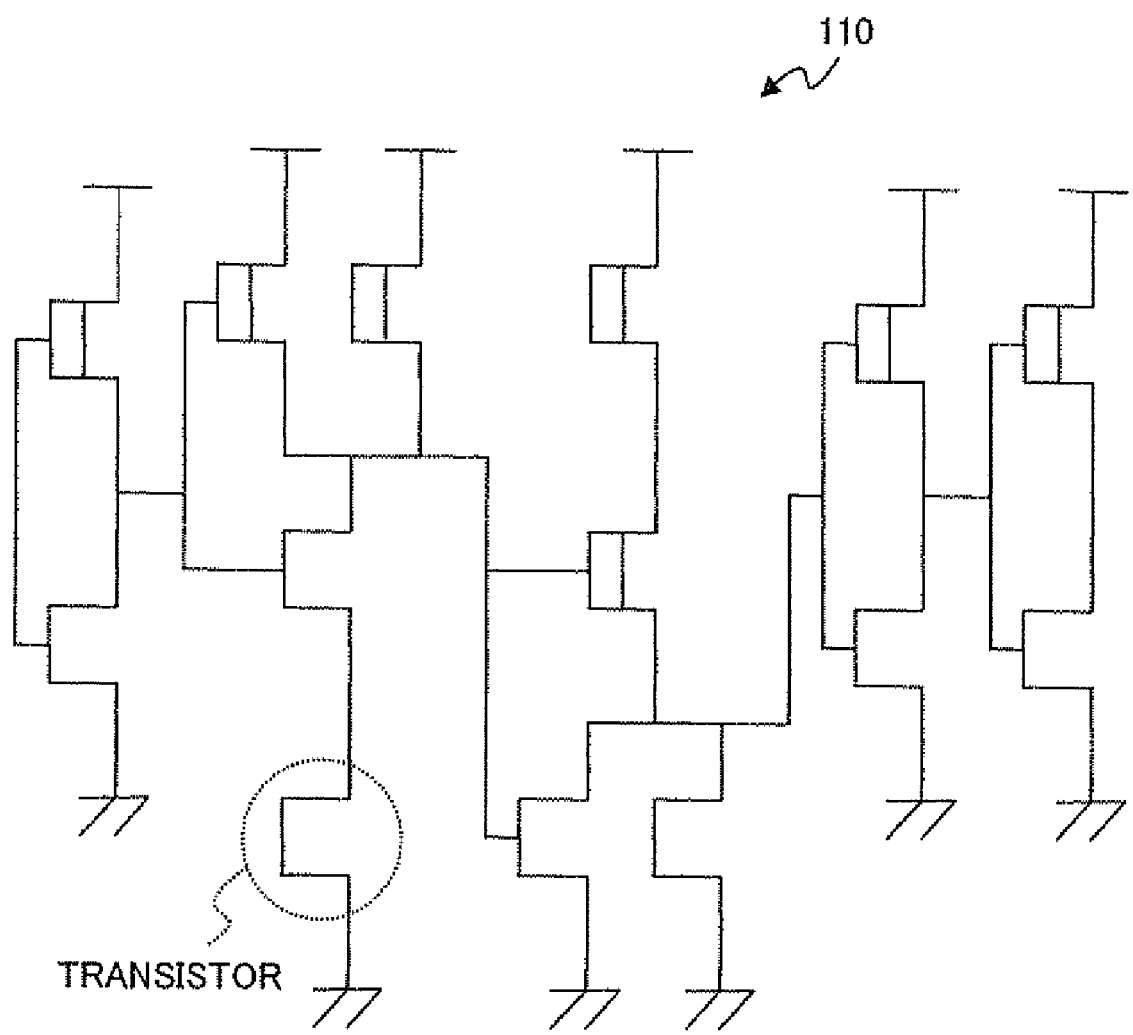
FIG. 13 is a diagram showing an example of a circuit to which previous timing analysis is applied.
Figure 14:
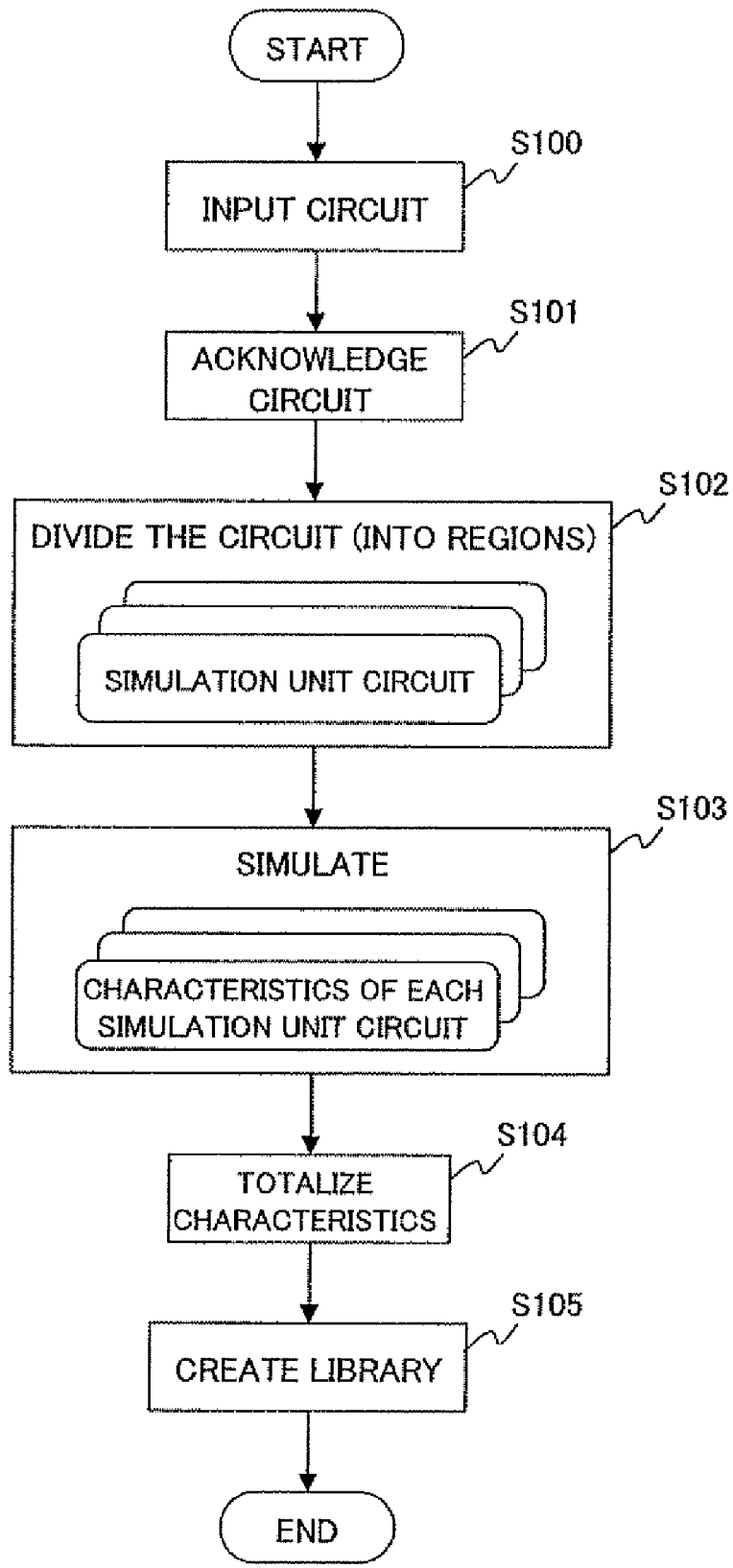
FIG. 14 is a flowchart indicating procedures of a previous library creating method.
Figure 15:
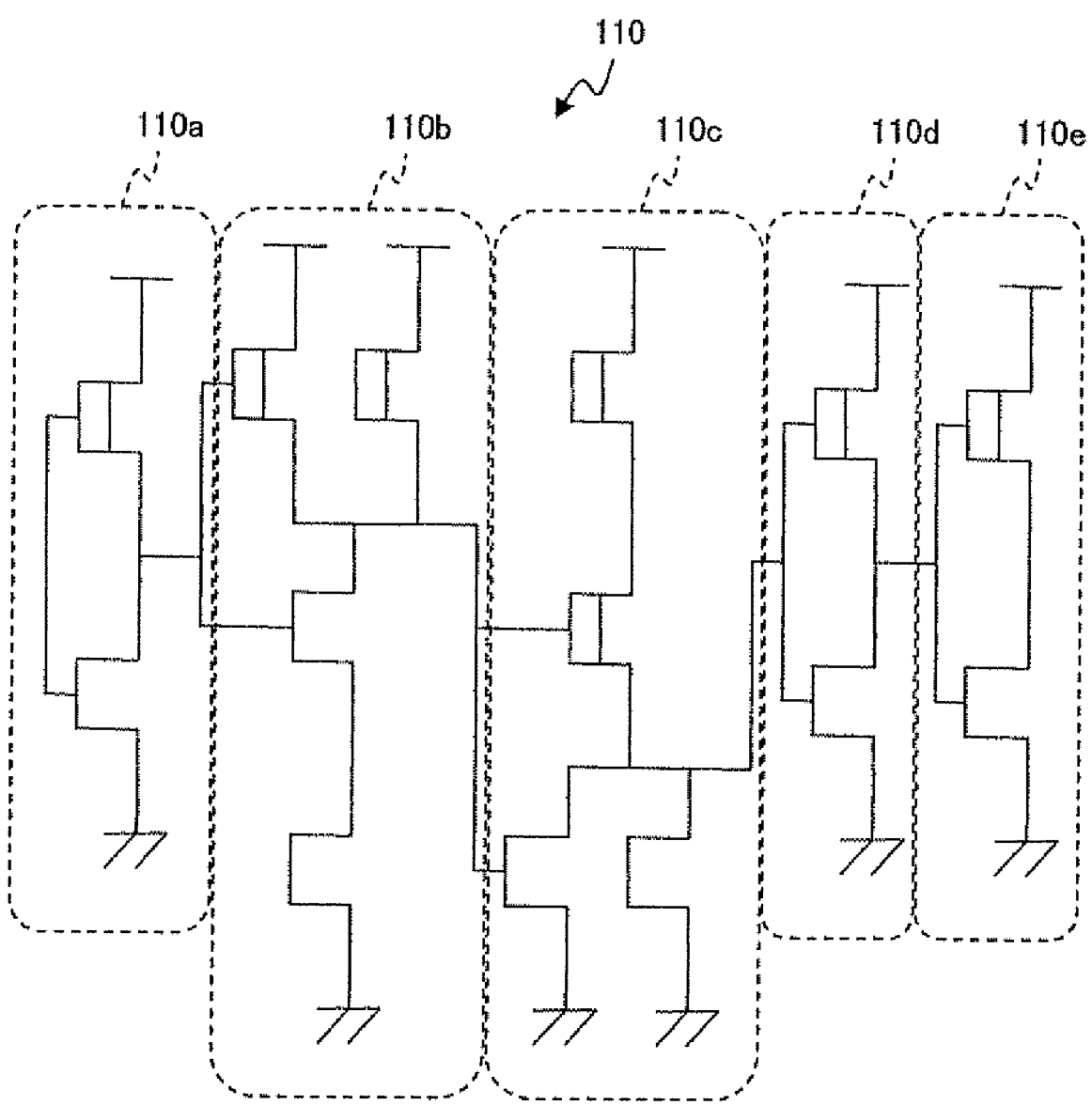
FIG. 15 is a diagram showing an example of a circuit of FIG. 13 which is divided into simulation unit circuits.

The dividing unit 13 divides the simulation object circuit recognized by the recognizing unit 12 into simulation unit circuits which are unit circuits each of which is separately subjected to simulation by the simulation unit 14. As in the case of the previous art already described with reference to FIG. 13 and FIG. 15, the dividing unit 13 separates the simulation object circuit at points appropriate for separation (for example, the number of transistors, the operation content of the circuit, or timing characteristics), thereby dividing the simulation object circuit into multiple simulation unit circuits.

Figure 5:
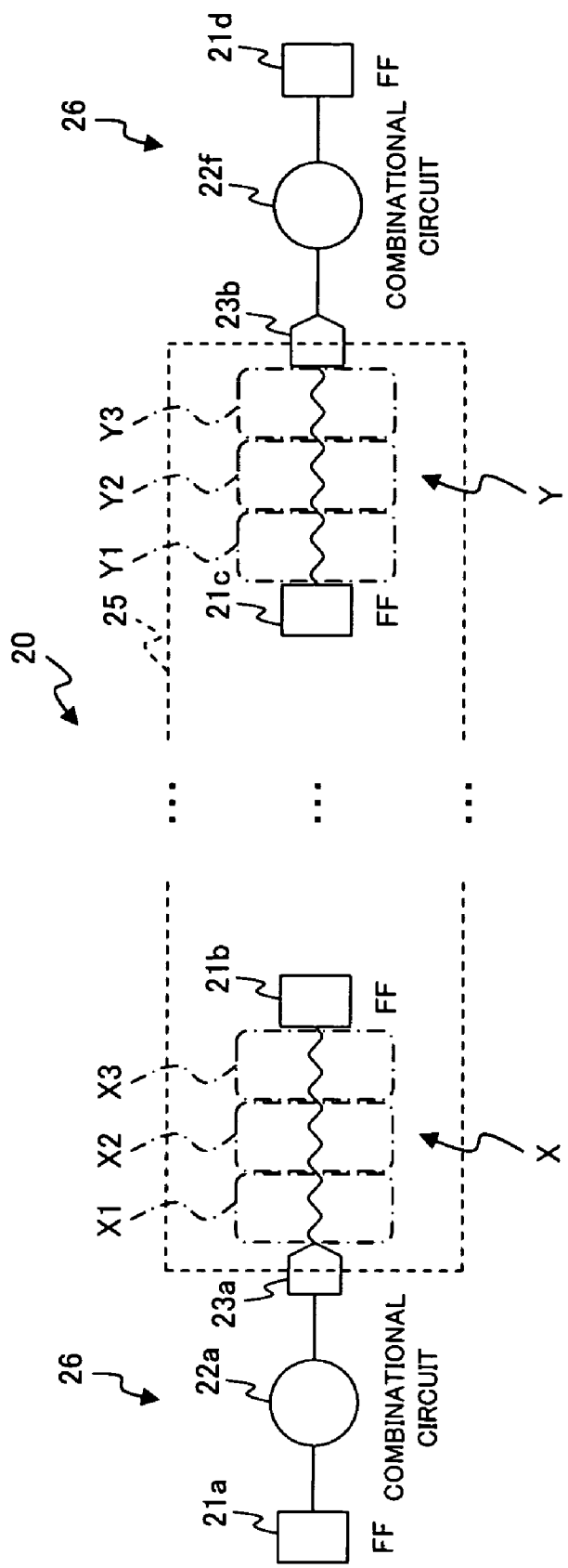
FIG. 5 is a diagram for describing a simulation object circuit in the circuit shown in FIG. 3.

For example, as shown in FIG. 5, the dividing unit 13 divides a circuit ranging from the input terminal 23a to the FF 21b (simulation object circuit X), which circuit has been recognized by the recognizing unit 12 as a simulation object circuit, into simulation unit circuits X1 through X3, and also divides a circuit (simulation object circuit Y) ranging from the output terminal 23b to the FF 21c, which circuit has been recognized as a simulation object circuit by the recognizing unit 12, into simulation unit circuits Y1 through Y3.

The simulation unit 14 simulates the simulation object circuits X and Y including the multiple simulation unit circuits X1 through X3 and Y1 through Y3, which have been obtained by the dividing unit 13. Here, timing analysis is performed on each of the simulation unit circuits X1 through X3 and Y1 through Y3, and measures characteristics, such as delay, of each simulation unit circuit X1 through X3 and Y1 through Y3.

That is, the simulation unit 14 analyzes the time required for a signal to reach the downstream end from the upstream end in each of the simulation unit circuits X1 through X3 and Y1 through Y3 divided by the dividing unit 13 of FIG. 5.

The creating unit 15 creates libraries of characteristic values of the simulation object circuits X and Y based on the simulation result obtained by the simulation unit 14. Here, as such characteristic values of the simulation object circuit, the times (signal arrival times) required for a signal to reach the downstream end from the upstream end of the simulation object circuits X and Y are stored in the database 10 in association with the simulation object circuits X and Y, libraries being thereby created.

Further, if the simulation unit 14 simulates multiple simulation circuits X1 through X3 and Y1 through Y3, the creating unit 15 totalizes the simulation results of simulation unit circuits X1 through X3 and Y1 through Y3 adjacent to one another, of the multiple simulation unit circuit X1 through X3 and Y1 through Y3, thereby creating libraries.

More specifically, as to the simulation unit circuits X1 through X3 and Y1 through Y3, the creating unit 15 accumulates the simulation results of the simulation unit circuits X1 through X3, thereby creating a library of the simulation object circuit X; the creating unit 15 totalizes the simulation results of the simulation unit circuits Y1 through Y3, thereby creating a library of the simulation object circuit Y.

Here, the creating unit 15 uses the sum of the signal arrival times, which are simulation results (timing analysis results) of the simulation unit circuits X1 through X3 obtained by the simulation unit 14, as the characteristic value of the simulation object circuit X, and makes a library thereof. Likewise, the creating unit 15 uses the sum of the signal arrival times of the simulation unit circuit Y1 through Y3 as the characteristic value of the simulation object circuit Y, and makes a library thereof.

The verifying unit 16 uses the library created by the creating unit 15 to perform operation verification (delay verification) of a circuit which is a combination of the high hierarchical circuits 26 and the low hierarchical circuit 25. The verifying unit 16 executes an operation verification of a circuit ranging from the FF 21a to the FF 21b and of a circuit ranging from the FF 21c to the FF 21d, which are shown in FIG. 5.

That is, the verifying unit 16 checks whether or not a signal can travel the path from the FF 21a to the FF 21b and the pass from the FF 21c to the FF 21d within one cycle time.

In this instance, as in the case of the simulation unit 14, the verifying unit 16 performs timing analysis of a circuit ranging from the FF 21a to the input terminal 23a, thereby obtaining a signal arrival time therebetween. Likewise, the verifying unit 16 performs timing analysis of a circuit ranging from the output terminal 23b to the FF 21d, thereby obtaining a signal arrival time therebetween.

Then, the verifying unit 16 evaluates whether or not the sum of the thus calculated signal arrival time between the FF 21a and the input terminal 23a and the signal arrival time between the input terminal 23a and the FF 21b (that is, the simulation object circuit X) held in the database 10 as a library is shorter than one cycle time inclusive, thereby executing operation verification of a circuit ranging from the FF 21a to the FF 21b.

Likewise, the verifying unit 16 also evaluates whether or not the sum of the calculated signal arrival time between the output terminal 23b and the FF 21d and the signal arrival time between the FF 21c and the output terminal 23b that is the simulation object circuitry held in the database 10 as a library is shorter than one cycle time inclusive, thereby executing operation verification of a circuit ranging from the FF 21c to the FF 21d.

Figure 6:
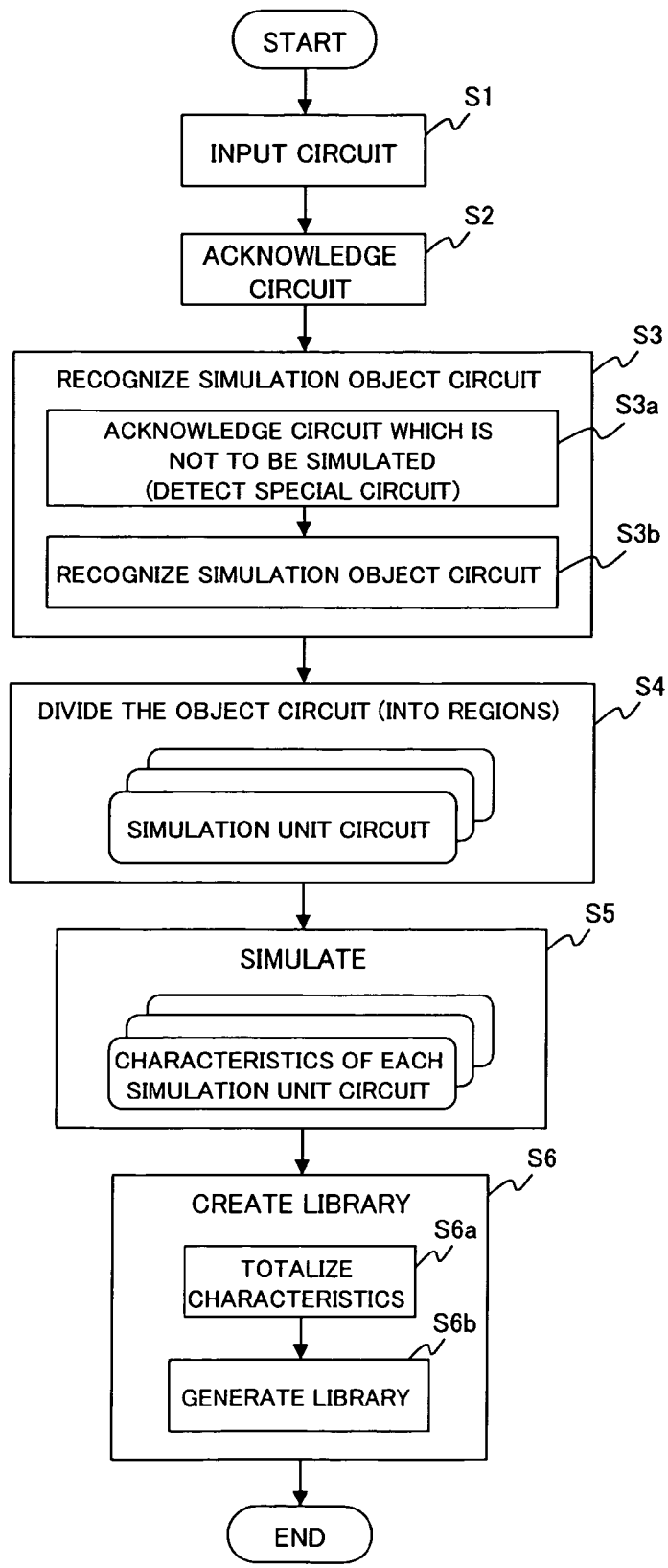
FIG. 6 is a flowchart indicating procedures in a library creating method according to the first embodiment of the present invention.

Next, referring to the flowchart (step S1 through step S6) of FIG. 6, a description will be made of operation procedures (library creating method) executed by the present simulation apparatus 1 (in particular, the library creating apparatus 2).

First of all, a designer inputs design data of a circuit 20 through a keyboard 6 and a mouse 7 shown in FIG. 2, and the input data is stored in the database 10 as design information (step S1; circuit input step).

Then, the circuit acknowledging unit 11 reads the design information of the circuit 20 held in the database 10, thereby acknowledging the circuit 20 (Step S2; circuit acknowledging step). In this instance, the circuit acknowledging unit 11 also acknowledges the low hierarchical circuit 25 and the high hierarchical circuit 26.

Next, the recognizing unit 12 recognizes simulation circuits X and Y(step S3; recognizing step) based on whether or not the low hierarchical circuit 25 of the circuit 20 includes a specific special circuit (a circuit which is not to be subjected to simulation; here, RAM 24).

More specifically, the recognizing unit 12 searches the low hierarchical circuit 25 of the circuit 20 and finds the RAM 24 (step S3a; special circuit detecting step).

Then, when detecting the RAM 24, as a special circuit, in the low hierarchical circuit 25, the recognizing unit 12 decides that the circuitry ranging from the FF 21b which is nearest to the detected RAM 24 on the upstream side thereof to the FF 21c which is nearest to the detected RAM 24 on the downstream side thereof is a circuit which needs not to be subjected to simulation, and recognizes the circuitry other than the above circuitry as simulation object circuits X and Y (step S3b; simulation object circuit recognizing step).

After that, the dividing unit 13 divides the simulation object circuits X and Y, which have been acknowledged by the recognizing unit 12, into multiple simulation unit circuits X1 through X3 and Y1 through Y3 (dividing into regions) (step S4; dividing step).

The simulation unit 14 then simulates the simulation object circuit X and Y, which have been divided into simulation unit circuits X1 through X3 and Y1 through Y3 by the dividing unit 13 (step S5; simulation step).

Resulting from simulation carried out by the simulation unit 14, a characteristic value (here, a signal arrival time) of each of the simulation unit circuits X1 through X3 and Y1 through Y3 is obtained.

After that, the creating unit 15 creates libraries of the characteristic values of the simulation object circuits X and Y (step S6; creating step), and then the processing ends.

More specifically, to create separate libraries of characteristic values of simulation object circuits X and Y, the creating unit 15 totalizes characteristics of the simulation unit circuits X1 through X3 (here, signal arrival times as characteristic values are summed up), and also, the creating unit 15 totalizes characteristics of the simulation unit circuits Y1 through Y3 (step S6a; accumulating step).

The creating unit 15 then stores the characteristic values, totalized separately for the simulation object circuits X and Y, in the database 10 in association with the simulation object circuits X and Y, thereby creating libraries of the characteristic values of the simulation object circuits X and Y (step S6b; library creating step), and the processing ends.

As described so far, according to the simulation apparatus 1 of the first embodiment of the present invention, at the time of operation verification of the circuit 20, the recognizing unit 12 recognizes the simulation object circuits X and Y in the low hierarchical circuit 25 whose libraries need to be created, and the simulation unit 14 simulates only the simulation object circuits X and Y recognized by the recognizing unit 12, and the creating unit 15 creates libraries of characteristic values of the simulation object circuits X and Y. As a result, since useless simulation processing or library creating processing will not be carried out for circuits which need not be simulated, libraries can be created efficiently in a significantly reduced time period.

That is, when libraries necessary for operation verification of the circuit 20 are created, only simulation object circuits whose libraries need to be created are extracted, and the other circuits which need not be simulated are excluded from the object of simulation and library-creation. As a result, in comparison with the previous art in which a library is created for the whole of the low hierarchical circuit 25, the number of circuits whose simulation is to be carried out is decreased, so that the time required for creating a library is reduced.

Further, since the recognizing unit 12 recognizes simulation object circuits based on whether or not a specific special circuit is included therein, it is possible for the recognizing unit 12 to reliably recognize the simulation object circuits in the low hierarchical circuit 25.

In this instance, the recognizing unit 12 detects a special circuit (here, the RAM 24), and decides that the circuitry ranging from the FF 21b nearest to the detected RAM 24 on the upstream side thereof to the FF 21c nearest to the RAM 24 on the downstream side thereof is a circuit which needs not be simulated, and that other circuitry of the low hierarchical circuit 25 than the above mentioned circuit is simulation object circuits X and Y. Therefore, in cases where the low hierarchical circuit 25 is designed so as to include therein a RAM 24 as a special circuit, and also where the RAM 24 is always interposed between two FFs with no other FF than the above two FFs included therein, considerably efficient recognition of the simulation object circuit X and Y is available.

2 Second Embodiment

Figure 7:
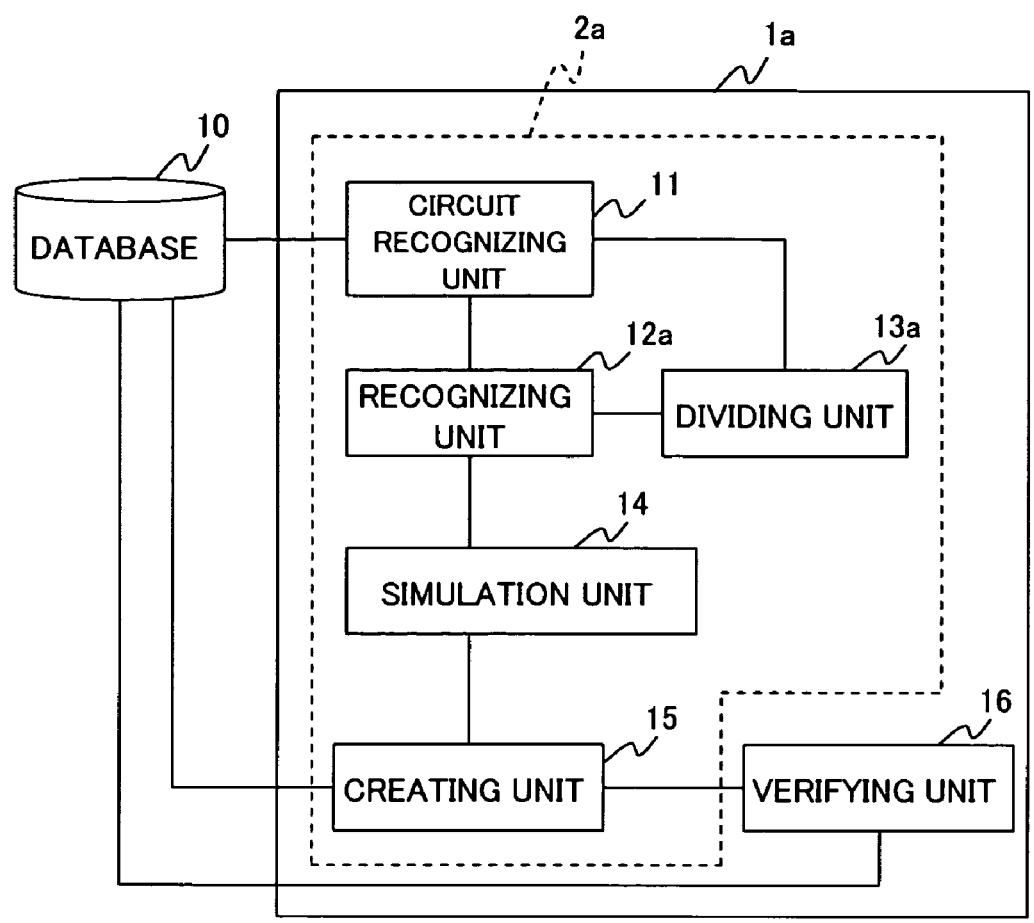
FIG. 7 is a block diagram showing a construction of a simulation apparatus according to the second embodiment of the present invention.

Next, referring to the block diagram of FIG. 7, a description will be made hereinbelow of a construction of the simulation apparatus 1a according to a second embodiment of the present invention. In FIG. 7, like reference characters designate elements the same or approximately the same as elements already described, so their detailed description is omitted here.

The present simulation apparatus 1a, which is connected to the database 10, includes: a circuit acknowledging unit 11; a recognizing unit 12a; a dividing unit 13a; a simulation unit 14; a creating unit 15; and a verifying unit 16. In the simulation apparatus 1a, the circuit acknowledging unit 11, the recognizing unit 12a, the dividing unit 13a, the simulation unit 14, and the creating unit 15 function as a library creating apparatus 2a.

As in the case of the above-described simulation apparatus 1 of the first embodiment, the simulation apparatus 1a is realized by an arithmetic operation unit 4 of a computer 3 shown in the above-described FIG. 2, for example.

The simulation apparatus 1a differs from the simulation apparatus 1 of the first embodiment in that the recognizing unit 12a directly recognizes a simulation object circuit in the low hierarchical circuit, and in that the dividing unit 13a divides the whole of the circuitry recognized by the circuit acknowledging unit 11 into simulation unit circuits.

Accordingly, a detailed description will made hereinbelow of the recognizing unit 12a and the dividing unit 13a of the simulation apparatus 1a. Further, as in the case of the first embodiment, an object of operation verification carried out by the simulation apparatus 1a is the circuit 20 of the above-described FIG. 3 and FIG. 5, and a description will be made of a simulation apparatus 1a using the circuit 20 shown in FIG. 3 and FIG. 5.

The dividing unit 13a divides at least the low hierarchical circuit 25 of the circuit 20 recognized by the circuit acknowledging unit 11 into multiple simulation unit circuits. As in the case of the previous art already described with reference to FIG. 13 and FIG. 15, the dividing unit 13 a separates the simulation object circuit at points appropriate for separation (for example, the number of transistors, the operation content of circuits, or timing characteristics), thereby dividing the whole of the low-hierarchical circuit 25 into multiple simulation unit circuits.

The recognizing unit 12a recognizes simulation object circuits X and Y from the low hierarchical circuit 25 which has been divided into multiple simulation unit circuits by the dividing unit 13a. The recognizing unit 12a recognizes circuitry ranging from the input end (the upstream end; that is, the input terminal 23a) of the low hierarchical circuit 25 to the FF 21b as a simulation object circuit X, and also recognizes circuitry ranging from the output end (the downstream end; that is, the output terminal 23b) to the FF 21c as a simulation object circuit Y.

Figure 8:
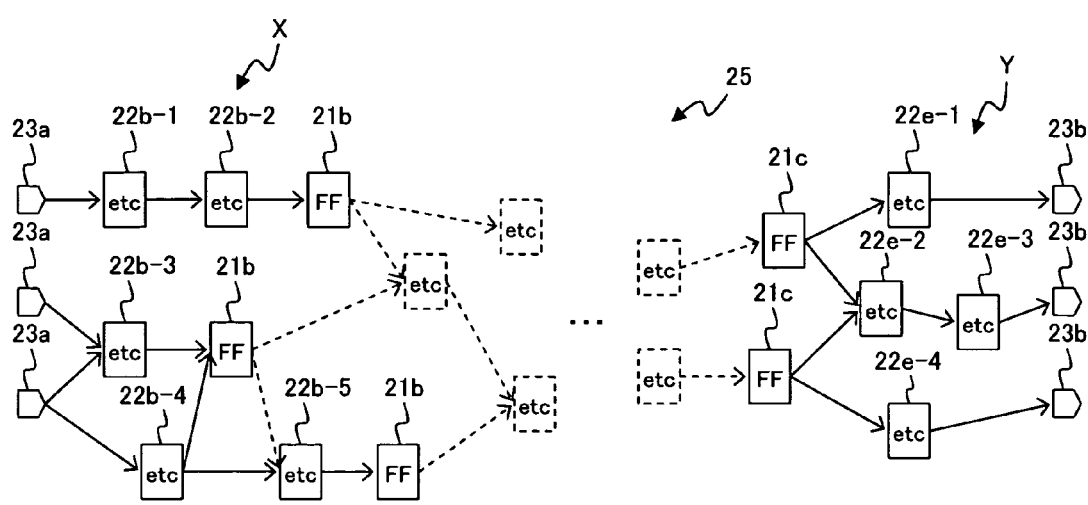
FIG. 8 is a diagram for describing a method for recognizing a simulation object circuit carried out by a recognizing unit of a simulation apparatus according to the second embodiment.

Here, FIG. 8 shows a part of the low hierarchical circuit 25 which has been divided into simulation unit circuits by the dividing unit 13a. In FIG. 8, each block indicated by solid lines or broken lines is a simulation unit circuit which has been obtained by the dividing unit 13a; each of the solid line arrows and the broken line arrows indicates a connection relationship among the simulation unit circuits and also the direction in which a signal flows. In addition, each of the simulation unit circuits 22b-1 through 22b-5 designated by "etc" in FIG. 8, is obtained as a result of dividing the combinational circuit 22b by the dividing unit 13a. Each of the simulation unit circuits 22e-1 through 22e-4 is obtained as a result of dividing the combinational circuit 22e by the dividing unit 13a.

The recognizing unit 12a performs downstream searching, starting from the input terminals 23a as input ends of the low hierarchical circuit 25, along connections, and evaluates whether or not the found-out circuit (region), an object being searched for, is a flip-flop (here, FF 21b).

In this instance, the recognizing unit 12a can check whether or not the object circuit which has been found has a construction of a flip-flop, thereby judging whether the object circuit is a flip-flop or not. Alternatively, design information contains information (for example, a flag) indicating whether or not each circuit is a flip-flop beforehand, and on the basis of this information, judgment is made on whether or not the object circuit which has been found is a flip-flop.

Then, the recognizing unit 12a continues such searching along connections until an FF 21b is found. When the FF 21b is found, a flag indicating that an FF 21b has been found is raised, and searching is performed no longer (see the block indicated by broken lines and broken line arrows in FIG. 8).

In this manner, the recognizing unit 12a recognizes the simulation unit circuit, ranging from the input terminal 23a to the found-out FF 21b, as a simulation object circuit X.

Further, the recognizing unit 12a also searches for a flip-flop (here, the FF 21c), starting from the output terminal 23b. Searching from the output terminal 23b is performed in the upstream direction, starting from the output terminal 23b and tracing connections in the direction opposite to the signal proceeding direction which is indicated by arrows in FIG. 8. Then, evaluation as to whether the found-out circuit is a flip-flop 21c or not is performed.

Then, the recognizing unit 12a continues such searching along connections until an FF 21c is found. When the FF 21c is found, a flag indicating that an FF 21c has been found is raised, and searching is performed no longer (see the block indicated by broken lines and broken line arrows in FIG. 8).

In this manner, the recognizing unit 12a recognizes the simulation unit circuit, ranging from the output terminal 23b to the found-out FF 21c, as a simulation object circuit Y.

As described so far, the recognizing unit 12a performs searching for a flip-flop along connections, starting from the input end or the output end of the low hierarchical circuit 25, thereby finding the simulation object circuits X and Y. In other words, a region between the FF 21b and the FF 21c, which searching from the input end and the output end by the recognizing unit 12a has not reached, is a region which need not be simulated (whose library needs not be created).

Figure 9:
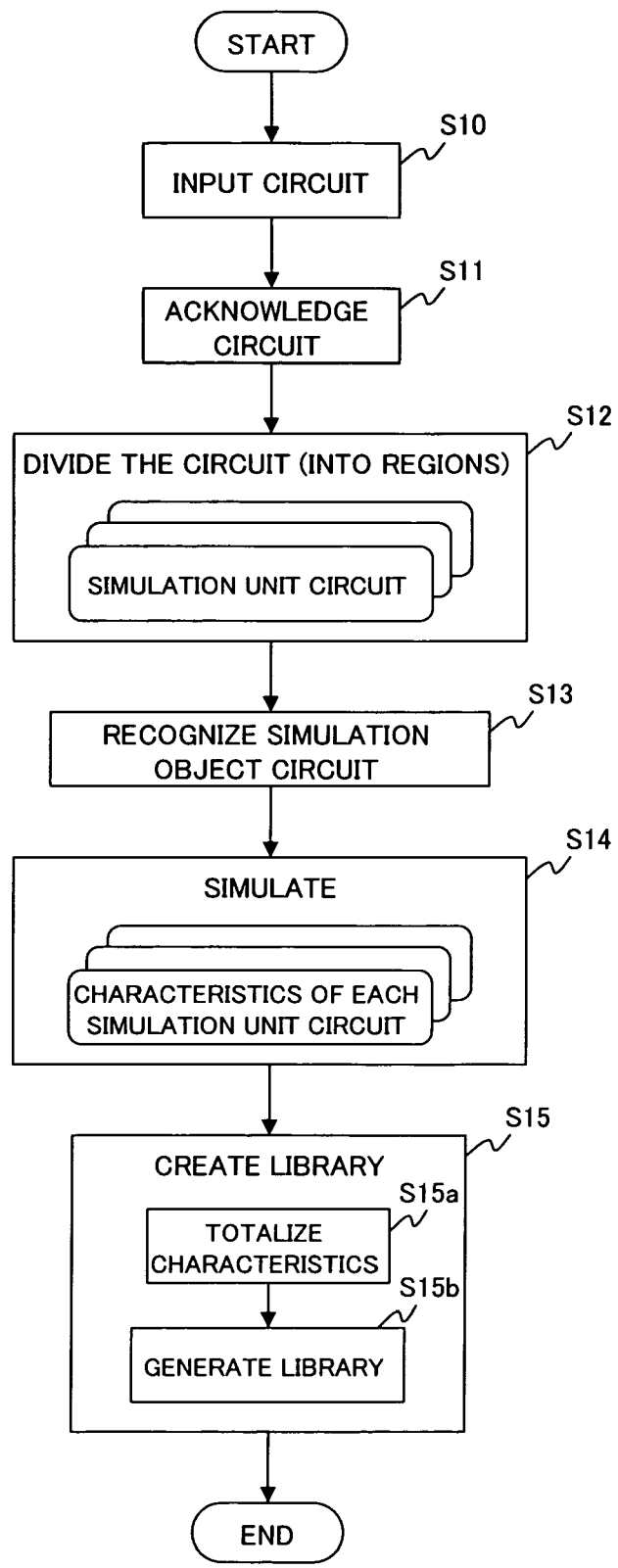
FIG. 9 is a flowchart indicating procedures of a library creating method according to the second embodiment.
Figure 10:
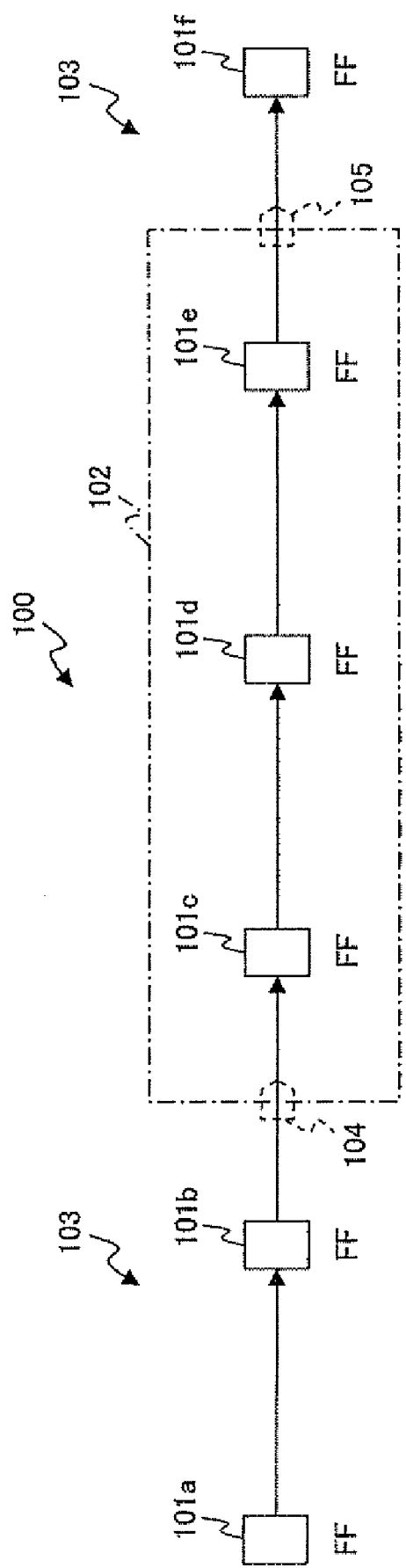
FIG. 10 is a diagram showing a synchronous circuit including FFs (Flip-Flops)
Figure 11:
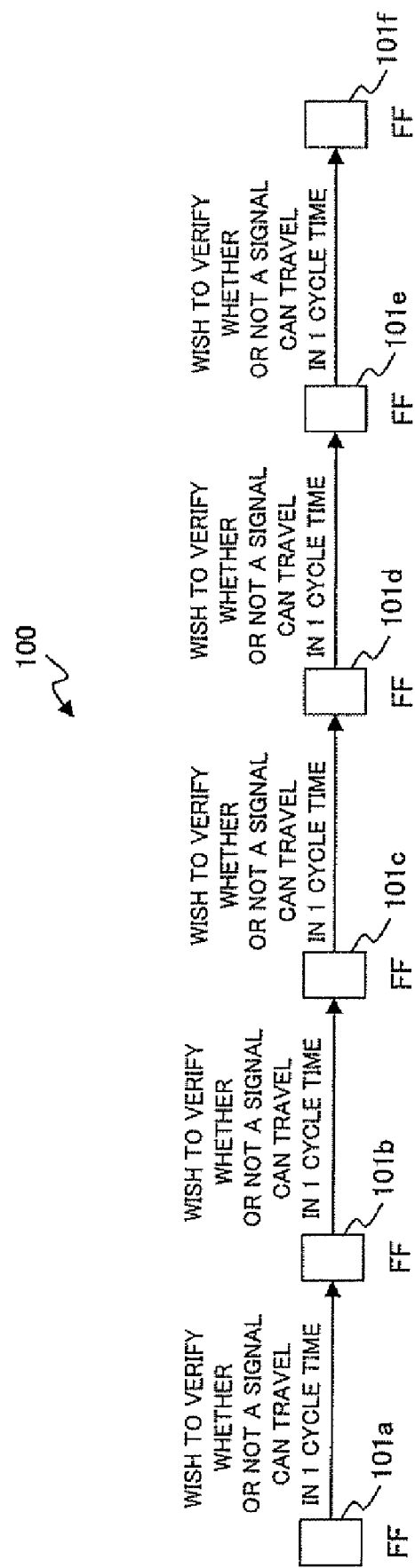
FIG. 11 is a diagram for describing delay verification performed on the synchronous circuit of FIG. 10.
Figure 12:
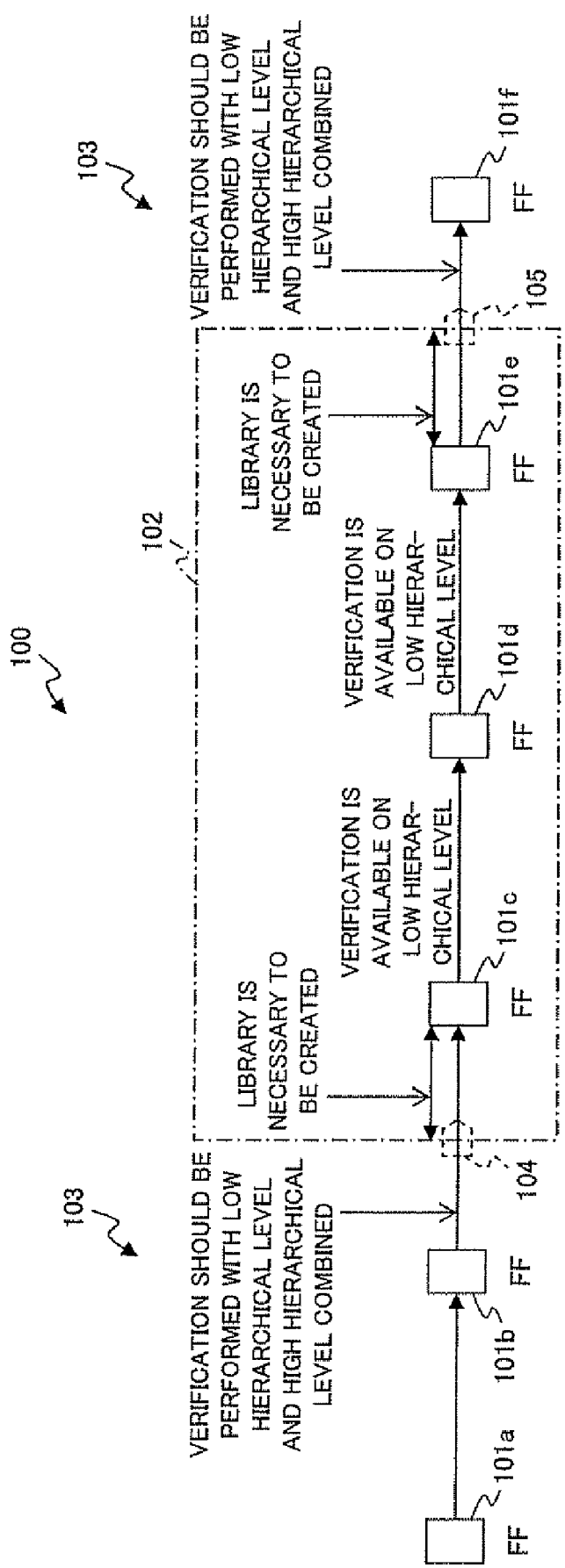
FIG. 12 is a diagram for describing a delay verification method performed among FFs of the synchronous circuit of FIG. 10.

Next, referring to the flowchart (step S10 through step S15) of FIG. 9, a description will be made hereinbelow of operation procedures (library creating method) of the present simulation apparatus 1a (in particular, the library creating apparatus 2a).

First of all, a designer inputs design data of a circuit 20 through a keyboard 6 and a mouse 7 shown in FIG. 2, and the input data is stored in the database 10 as design information (step S10; circuit input step).

Then, the circuit acknowledging unit 11 reads the design information of the circuit 20 held in the database 10, thereby acknowledging the circuit 20 (step S11; circuit acknowledging step).

Next, the dividing unit 13a divides the circuit 20 (in particular, the low hierarchical circuit 25), acknowledged by the circuit acknowledging unit 11, into multiple simulation unit circuits (step S12; dividing step).

The recognizing unit 12a recognizes simulation circuits X and Y (step S13; recognizing step) from the low hierarchical circuit 25 which has been divided into simulation unit circuits by the dividing unit 13a.

The simulation unit 14 then simulates each of the simulation unit circuits forming the simulation object circuit X and Y, which have been recognized as simulation objects by the recognizing unit 12a (step S14; simulation step). The creating unit 15 creates a library of the characteristic values of the simulation object circuits X and Y (step S15; creating step) based on the simulation result obtained by the simulation unit 14, and then the processing ends.

Here, the creating unit 15 totalizes (sums up) characteristic values (here, signal arrival times) of adjacent simulation unit circuits, as simulation result, thereby obtaining a total characteristic value for each of the simulation object circuit X and Y (step S15a; totalizing step. The characteristic values summed up separately for the simulation object circuits X and Y are stored in the database 10 in association with the simulation object circuits X and Y, thereby creating libraries of characteristic values of the simulation object circuits X and Y (step S15b; library creating step).

As described so far, according to the simulation apparatus 1a of the second embodiment of the present invention, like effects to those of the first embodiment can be obtained.

Further, according to the simulation apparatus 1a, the recognizing unit 12a recognizes the circuitry ranging from the input end (input terminal 23a) of the low hierarchical circuit 25 to the FF 21b as the simulation object circuit X, and also recognizes the circuitry ranging from the output end (output terminal 23b) to the FF 21c as the simulation object circuit Y. It is thus possible to reliably recognize the simulation object circuits X and Y regardless of the construction of the low hierarchical circuit 25.

In other words, differing from the recognizing unit 12 of the simulation apparatus 1 of the first embodiment already described, the recognizing unit 12a does not recognize simulation object circuits based on a special circuit included in the low hierarchical circuit 25. The recognizing unit 12a is thus capable of recognizing simulation object circuits from the low hierarchical circuit 25 which includes no such special circuit, and is capable of reliably extracting the simulation object circuits.

Further, even in cases where the low hierarchical circuit 25 includes three or more flip-flops, which cannot be supported by the simulation apparatus 1 of the first embodiment, it is still possible for the recognizing unit 12a to recognize a simulation object circuit by tracing connections from the input and the output end.

3 Other Modifications

The present invention should by no means be limited to the above-illustrated embodiment, and various changes or modifications may be suggested without departing from the gist of the invention.

For example, in the first embodiment, a specific special circuit based on which the recognizing unit 12 recognizes circuitry whose simulation is unnecessary is a RAM 24. However, the present invention should by no means be limited to this, and the recognizing unit 12 can recognize circuitry whose simulation is unnecessary based on a dynamic domino circuit or a para transistor which serves as a specific special circuit.

Further, in the first embodiment, the library creating apparatus 2 creates libraries only for the simulation object circuits X and Y of the low hierarchical circuit 25, and timing analysis is performed for the high hierarchical circuit 26 by the verifying unit 16. The present invention should by no means be limited to this, and for example, the creating unit 15 of the library creating apparatus 2 can create libraries for not only the simulation object circuit X and Y of the low circuit but also for the high hierarchical circuit 26. The verifying unit 16 then performs operation verification of a circuit from the FF 21a to the FF 21b and of a circuit from the FF 21c to the FF 21d, based on the library of the high hierarchical circuit 26 and the libraries of the simulation object circuits X and Y, created by the creating unit 15. This will realize like effects to those of the first embodiment already described.

The above-described functions as the circuit acknowledging unit 11, the recognizing units 12 and 12a, the dividing units 13 and 13a, the simulation unit 14, and the creating unit 15, can be realized by a computer (including a CPU, an information processing apparatus, and various types of terminals) which executes a specific application program (a library creating program).

Further, the above-described functions as the circuit acknowledging unit 11, the recognizing units 12 and 12a, the dividing units 13 and 13a, the simulation unit 14, the creating unit 15, and the verifying unit 16, can be realized by a computer (including a CPU, an information processing apparatus, various types of terminals) which executes a specific application program (a simulation program).

Such programs are recorded in computer-readable recording media such as flexible discs, CDs (CD-ROMs, CD-Rs, and CD-RWs), andDVDs (DVD-ROMs, DVD-RAMs, DVD-Rs, DVD-RWs, DVD+Rs, and DVD+RWs). The computer reads the library creating program or the simulation program from such recording media to transfer the program to an internal or external storage device, to store the program therein. Alternatively, the programs can be recorded in storage devices (recording media) such as magnetic discs, optical discs, and magneto-optical discs, to be transferred to the computer over a communication network.

Here, the "computer" is defined as a concept including hardware and an OS (Operating System), or hardware operating under control of an OS. Further, in cases where hardware is capable of operating by itself without the necessity of an OS, the hardware is equivalent to the "computer". The hardware includes at least a micro processor such as a CPU and a means for reading computer programs from recording media.

An application program as the aforementioned library creating program contains program codes that instruct the computer to function as the circuit acknowledging unit 11, the recognizing units 12 and 12a, the dividing units 13 and 13a, the simulation unit 14, and the creating unit 15. Further, a part of those functions can be realized by the OS, not by such an application program.

An application program such as the aforementioned simulation program contains program codes that instruct the computer to function as the circuit acknowledging unit 11, the recognizing units 12 and 12a, the dividing units 13 and 13a, the simulation unit 14, the creating unit 15, and the verifying unit 16. Further, a part of those functions can be realized by the OS, not by such an application program.

Moreover, as recording media used in the embodiments of the present invention, not only the above-mentioned flexible discs, CDs, DVDs, magnetic discs, optical discs, and magneto-optical discs, but also various types of other computer-readable media, such as IC cards, ROM cartridges, magnetic tapes, punch cards, internal storage devices (memories such as RAMs and ROMs) of computers, external storage devices, barcodes, are also applicable.

What is claimed is:

1. A library creating apparatus, comprising:
a recognizing unit which recognizes a simulation object circuit in circuitry by searching downstream for a specific circuit, evaluating whether the specific circuit is a flip-flop and recognizing a circuit ranging from an input end of the circuitry to the specific circuit as the simulation object circuit to be simulated;
a simulation unit which simulates the simulation object circuit recognized by said recognizing unit; and
a creating unit which creates a library of characteristic values of the simulation object circuit based on a simulation result obtained by said simulation unit.

2. A library creating apparatus, comprising:
a recognizing unit which recognizes a simulation object circuit in circuitry by searching upstream for a specific circuit, evaluating whether the specific circuit is a flip-flop and recognizing a circuit ranging from an output end of the circuitry to the specific circuit as the simulation object circuit to be simulated;
a simulation unit which simulates the simulation object circuit recognized by said recognizing unit; and
a creating unit which creates a library of characteristic values of the simulation object circuit based on a simulation result obtained by said simulation unit.

3. A library creating apparatus, comprising:
a dividing unit which divides circuitry into a plurality of potential simulation object circuits;
a recognizing unit which recognizes a simulation object circuit in the circuitry by recognizing the simulation object circuit from the potential simulation object circuits obtained by said dividing unit by performing searching of each of the potential simulation object circuits in a downstream direction by tracing connections from an input end terminal and evaluating whether the potential simulation object circuit is a flip-flop, and performing searching of each of the potential simulation object circuits in an upstream direction by tracing connections from an output end terminal and evaluating whether the potential simulation object circuit is a flip-flop;
a simulation unit which simulates the simulation object circuit recognized by said recognizing unit; and
a creating unit which, when said simulation unit has simulated the simulation object circuit creates a library of characteristic values of the simulation object circuit.

4. A library creating apparatus, comprising:
a recognizing unit which recognizes a simulation object circuit in circuitry by deciding that a circuit containing a specific special circuit is not a simulation object circuit;
a simulation unit which simulates the simulation object circuit recognized by said recognizing unit; and
a creating unit which creates a library of characteristic values of the simulation object circuit based on a simulation result obtained by said simulation unit.

5. A library creating apparatus as set forth in claim 4, wherein said recognizing unit detects the specific special circuit, and recognizes a range of circuitry ranging from a flip-flop arranged nearest to the detected specific circuit on the upstream side thereof to another flip-flop arranged nearest to the detected specific circuit on the downstream side thereof, as circuitry whose simulation is unnecessary, and recognizes circuitry other than the range of circuitry as the simulation object circuit.

6. A library creating method, comprising:
recognizing, by a computer, a simulation object circuit in circuitry by searching downstream for a specific circuit, evaluating whether the specific circuit is a flip-flop, and recognizing a circuit ranging from an input end of the circuitry to the specific circuit as the simulation object circuit to be simulated;
simulating the simulation object circuit recognized by said recognizing; and
creating a library of characteristic values of the simulation object circuit based on a simulation result obtained by said simulating.

7. A library creating method, comprising: recognizing, by a computer, a simulation object circuit in circuitry by searching upstream for a specific circuit, evaluating whether the specific circuit is a flip-flop, and recognizing a circuit ranging from an output end of the circuitry to the specific circuit as the simulation object circuit to be simulated;
simulating the simulation object circuit recognized by said recognizing; and
creating a library of characteristic values of the simulation object circuit based on the simulation result obtained by said simulating.

8. A library creating method, comprising:
dividing the circuitry into a plurality of potential simulation object circuits;
recognizing, by a computer, a simulation object circuit in circuitry from the plurality of potential simulation object circuits obtained by said dividing by performing searching of each of the potential simulation object circuits in a downstream direction by tracing connections from an input end terminal and evaluating whether the potential simulation circuit is a flip-flop, and performing searching of each of the potential simulation circuits in an upstream direction by tracing connections from an output end terminal and evaluating whether the potential simulation circuit is a flip-flop;
simulating the simulation object circuit recognized by said recognizing; and
creating a library of characteristic values of the simulation object circuit based on the simulating.

9. A library creating method, comprising:
recognizing, by a computer, a simulation object circuit in circuitry based on whether the circuit contains a specific special circuit, and a circuit containing the specific special circuit is recognized as not being a simulation object circuit;
simulating the simulation object circuit recognized by said recognizing; and
creating a library of characteristic values of the simulation object circuit based on a simulation result obtained by said simulating.

10. A library creating method as set forth in claim 9, wherein during said recognizing, the specific special circuit is detected, and a range of circuitry ranging from a flip-flop arranged nearest to the detected specific circuit on the upstream side thereof to another flip-flop arranged nearest to the detected specific circuit on the downstream side thereof, is recognized as circuitry whose simulation is unnecessary, and circuitry other than the range of circuitry is recognized as the simulation object circuit.

11. A computer-readable storage having encoded thereon a computer program that when executed by a computer causes the computer to perform a process of creating a library of characteristic values of circuitry, the process comprising:
recognizing a simulation object circuit in circuitry by searching, evaluating whether the specific circuit is a flip-flop, and recognizing a circuit ranging from an input end of the circuitry to the specific circuit as the simulation object circuit to be simulated;

simulating the simulation object circuit recognized by said recognizing; and creating a library of characteristic values of the simulation object circuit based on a simulation result obtained by said simulating.

12. A computer-readable storage having encoded thereon a computer program that when executed by a computer causes the computer to perform a process of creating a library of characteristic values of circuitry, the process comprising:

recognizing a simulation object circuit in circuitry by searching upstream for a specific circuit, evaluating whether the specific circuit is a flip-flop, and recognizing a circuit ranging from an output end of the circuitry to the specific circuit as the simulation object circuit to be simulated;

simulating the simulation object circuit recognized by said recognizing; and creating a library of characteristic values of the simulation object circuit based on a simulation result obtained by said simulating.

13. A computer-readable storage having encoded thereon a computer program that when executed by a computer causes the computer to perform a process of creating a library of characteristic values of circuitry, the process comprising:

recognizing a simulation object circuit in circuitry based on whether the circuit contains a specific special circuit, and a circuit containing the specific special circuit is recognized as not being a simulation object circuit;

simulating the simulation object circuit recognized by said recognizing; and creating a library of characteristic values of the simulation object circuit based on a simulation result obtained by said simulating.

14. A computer-readable storage as set forth in claim 13, wherein during said recognizing the specific special circuit is detected, and a range of circuitry ranging from a flip-flop arranged nearest to the detected specific circuit on the upstream side thereof to another flip-flop arranged nearest to the detected specific circuit on the downstream side thereof, is recognized as circuitry whose simulation is unnecessary, and circuitry other than the range of circuitry is recognized as the simulation object circuit.

15. A simulation apparatus which carries out operation verification of circuitry including a low hierarchical circuit and a high hierarchical circuit, said apparatus comprising:

a recognizing unit recognizing a simulation object circuit in the low hierarchical circuit by searching downstream for a specific circuit, evaluating whether the specific circuit is a flip-flop, and recognizing a circuit ranging from an input end of the circuitry to the specific circuit as the simulation object circuit to be simulated;

a simulation unit simulating a simulation object circuit recognized by said recognizing unit;

a creating unit creating a library of characteristic values of the simulation object circuit based on the simulation result obtained by said simulation unit; and a verifying unit carrying out the operation verification using the library created by said creating unit.

16. A simulation apparatus which carries out operation verification of circuitry including a low hierarchical circuit and a high hierarchical circuit, said apparatus comprising:

a recognizing unit recognizing a simulation object circuit in the low hierarchical circuit by searching upstream for a specific circuit, evaluating whether the specific circuit is a flip-flop, and recognizing a circuit ranging from an output end of the circuitry to the specific circuit as the simulation object circuit to be simulated;

a simulation unit simulating a simulation object circuit recognized by said recognizing unit;

a creating unit creating a library of characteristic values of the simulation object circuit based on the simulation result obtained by said simulation unit; and a verifying unit carrying out the operation verification using the library created by said creating unit.

17. A simulation apparatus which carries out operation verification of circuitry including a low hierarchical circuit and a high hierarchical circuit, said apparatus comprising:

a dividing unit dividing the circuitry into potential simulation object circuits;

a recognizing unit recognizing a simulation object circuit in the low hierarchical circuit from the potential simulation object circuits obtained by said dividing unit by performing searching of each of the potential simulation object circuits in a downstream direction by tracing connections from an input end terminal and evaluating whether the potential simulation object circuit is a flip-flop, and performing searching of each of the potential simulation circuits in an upstream direction by tracing connections from an output end terminal and evaluating whether the potential simulation object circuit is a flip-flop;

a simulation unit simulating the simulation object circuit recognized by said recognizing unit;

a creating unit, when said simulation unit has simulated the simulation object circuit to create a library of characteristic values of the simulation object circuit; and a verifying unit carrying out the operation verification using the library created by said creating unit.

18. A simulation apparatus which carries out operation verification of circuitry including a low hierarchical circuit and a high hierarchical circuit, said apparatus comprising:

a recognizing unit recognizing a simulation object circuit in the low hierarchical circuit by deciding that a circuit containing a specific special circuit is not a simulation object circuit;

a simulation unit simulating a simulation object circuit recognized by said recognizing unit;

a creating unit creating a library of characteristic values of the simulation object circuit based on the simulation result obtained by said simulation unit; and a verifying unit carrying out the operation verification using the library created by said creating unit.

* * * * *

UNITED STATES PATENT AND TRADEMARK OFFICE
CERTIFICATE OF CORRECTION

PATENT NO. : 7,539,959 B2  
APPLICATION NO. : 11/406302  
DATED : May 26, 2009  
INVENTOR(S) : Kenichi Nabeya It is certified that error appears in the above-identified patent and that said Letters Patent is hereby corrected as shown below:

Column 16, Line 67, change "searching," to --searching downstream for a specific circuit,--.

Signed and Sealed this

First Day of September, 2009

David J. Kappos  
*Director of the United States Patent and Trademark Office*